US007312638B2

(12) United States Patent
Kobashi

(10) Patent No.: US 7,312,638 B2
(45) Date of Patent: Dec. 25, 2007

(54) SCANNING LINE DRIVING CIRCUIT, DISPLAY DEVICE, AND ELECTRONIC APPARATUS

(75) Inventor: Yutaka Kobashi, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 407 days.

(21) Appl. No.: 11/067,887

(22) Filed: Mar. 1, 2005

(65) Prior Publication Data

US 2005/0248558 A1 Nov. 10, 2005

(30) Foreign Application Priority Data

May 6, 2004 (JP) ............................ 2004-137472

(51) Int. Cl.
*H03K 19/094* (2006.01)
*H03K 19/0175* (2006.01)

(52) U.S. Cl. ........................... 326/83; 326/82; 326/80; 326/81

(58) Field of Classification Search .................. 326/68, 326/80-83; 327/333
See application file for complete search history.

(56) References Cited

U.S. PATENT DOCUMENTS 5,723,986 A * 3/1998 Nakashiro et al. ............ 326/81
6,157,361 A * 12/2000 Kubota et al. .............. 345/100
6,670,944 B1 12/2003 Ishii

FOREIGN PATENT DOCUMENTS

JP A-2000-163003 6/2000
JP A-2001-265297 9/2001

* cited by examiner

*Primary Examiner*—Anh Q. Tran
(74) *Attorney, Agent, or Firm*—Oliff & Berridge, PLC

(57) ABSTRACT

To reduce a voltage applied to a scanning line driving circuit. Buffer circuits respectively connected to gate electrodes of an N-channel transistor and a P-channel transistor which are connected to the scanning lines are provided and driving voltages are made different from each other, such that voltages applied to the buffer circuits are reduced.

12 Claims, 9 Drawing Sheets

L/S(L) (511-n)

L/S(H) (521-n)

SCANNING LINE DRIVING CIRCUIT, DISPLAY DEVICE, AND ELECTRONIC APPARATUS

BACKGROUND

The present invention relates to a scanning line driving circuit, a display device, and a portable electronic apparatus, and particularly, to a scanning line driving circuit for a display device using an active matrix substrate.

In recent years, notebook personal computers and monitors equipped with liquid crystal display devices using active elements, such as thin film transistors (TFTs), have been rapidly spread. Particularly, a much attention has been paid to a poly silicon TFT in which polysilicon is used for an active layer thereof since driving circuits to be mounted on a substrate using the high movability of the polysilicon TFT.

A general liquid crystal display device using a nematic liquid crystal material requires alternating current driving in which the polarity of a voltage applied to liquid crystal is reversed at a predetermined time in order to secure the reliability of the device. Since the difference between the voltages applied to the liquid crystal at the time of white display and at the time of black display is in the range of 3 to 5 V, in order to perform the alternating current driving, signals having a voltage amplitude of 6 to 10 V should be input to pixel electrodes on an active matrix substrate. Further, in order to obtain a sufficient switching characteristic, it is necessary to apply a voltage greater than that of the signal input to the pixel electrodes by 2 to 5 V to scanning lines connected to gates of pixel switching TFTs. Finally, a scanning line driving circuit of the liquid crystal display device needs to output a signal voltage of about 8 to 15 V. The voltage tends to increase with an increase in the side and precision of the liquid crystal display device. In addition, when the scanning line driving circuit is mounted on a glass substrate, it is general to drive the scanning line driving circuit at a voltage of 10 to 15 V.

Further, a self-emitting display device using organic EL (OLE) elements is currently being developed as a next-generation display device. However, a polysilicon TFT active matrix capable of flowing a large amount of current is generally used for driving the organic EL elements. In this case, a voltage of 5 to 20 is also needed to drive the organic EL elements, and thus it is necessary to apply, to the scanning lines, a voltage equal to or greater than that used for the liquid crystal display device.

However, a timing signal or a clock signal required to driving the scanning line driving circuit is generally input from an external IC. Therefore, in order for an IC to output a signal having a voltage amplitude greater than 5 V, it is necessary to manufacture an IC having high voltage resistance using a special manufacturing process, which causes an increase in costs.

In order to solve the above-mentioned problems, a circuit configuration is effective in which a level shifter is incorporated into a scanning line driving circuit mounted on a glass substrate and the voltage of a signal having a voltage amplitude of 3 to 5 V input from an IC is raised to a voltage amplitude of 8 to 15 V. For example, Patent Document 1 discloses a method in which the voltage of a signal input from an IC circuit is raised and the voltage-raised signal is then input to a shift register.

However, in the case of a polysilicon TFT, particularly, a so-called low-temperature process polysilicon (LTPS) TFT obtained by forming polysilicon on a no-alkali glass substrate at a temperature of less than 600° C., a gate insulating film is generally formed by a chemical vacuum deposition (CVD) method, which has voltage resistance and defect density lower than those of a gate insulating film formed by a thermal oxidation method generally used for forming a transistor on a monocrystalline silicon wafer. Therefore, it is not preferable to apply a high voltage to the main body of the driving circuit from the viewpoint of reliability and yield.

Meanwhile, with a rapid increase in the performance of a polysilicon TFT in recent years, a logical circuit system including a shift register provided in the scanning line driving circuit can driven at a voltage of 3 to 5 V. Therefore, for example, Patent Document 2 discloses the following configuration: a logical circuit, such as a shift register, is driven at a relatively low voltage (which is referred to as a logical circuit-based power supply voltage); the voltage of a signal output from the logical circuit is raised to a relatively high voltage (which is referred to as a driving circuit-based power supply voltage), and then the signal having a high voltage is input to a scanning line through a buffer circuit. Thus, this configuration has been widely used in recent years since power consumption decreases and reliability increases.

FIG. 10 shows the structure of a conventional scanning line driving circuit. Here, it is considered a scanning line driving circuit for driving a liquid crystal display device having 480 scanning lines. A shift register circuit (350) is mounted in the scanning line driving circuit, and a CLK signal terminal (601), a CLKX signal terminal (602), and an XST signal terminal (603) are connected to the scanning line driving circuit. The shift register has a total of 481 output terminals (504-1 to 504-481) composed of the last terminal and 480 stages, each stage comprising a first clocked inverter (**351-*n*), a second clocked inverter (352-*n*), and a first inverter (353-*n***).

In the shift register circuit (350), an n-th (=1 to 480) output terminal (**504-*n*) and an (n+1)-th output terminal (504-*n*+1) are connected to input terminals of an NAND circuit (505-*n*), respectively. Here, the first and second clocked inverters (351-*n* and 352-*n*), the first inverter (353-*n*), the NAND circuit (505-*n*) are connected to power supply terminals having potentials of VD and VS (VD>VS), respectively, and the potential of a signal output from the NAND circuit (505-*n***) has an amplitude of VD−VS.

An output terminal of the NAND circuit (**505-*n*) is connected to a level shifter (506-*n*), and the potential of the signal having the amplitude of VD−VS is amplified to a potential of VH−VL. Here, the relationship VH>VD>VS>VL is established. The signal having the potential amplified by the level shifter circuit (506-*n*) is input to a scanning line through a second inverter (507-*n*), a third inverter (508-*n*), and a fourth inverter (509-*n*). Here, the second to fourth inverters (507-*n* to 509-*n***) are respectively composed of buffer circuits for enhancing a driving performance and are respectively connected to a potential VH and a potential VL, both serving as power supplies.

FIG. 12 shows the structure of the level shifter circuit (**506-*n*). The level shifter circuit comprises a separating unit (550) for dividing a signal into a positive polarity and a negative polarity and for outputting them, a High-level amplifying unit (551) for amplifying a signal level of VD−VS to a signal potential of VH−VS, and a Low-level amplifying unit (552) for amplifying a signal potential of VH−VS to a signal potential of VH−VL. The structures of the High-level amplifying unit (551) and the Low-level amplifying unit (552) are known as a so-called flip-flop-type level shifter and are generally used for the scanning line driving circuit since their normal power consumption is small at the time of non-operation. Of course, a structure in which the positions of the High-level amplifying unit (551) and the Low-level amplifying unit (552) are changed to each other can be used. In addition, a structure in which the High-level amplifying unit (551) or the Low-level amplifying unit (552**) is absent can be used. However, in this case, when the difference between VH–VL and VD–VS is extremely large, the level shifter is unavailable. Thus, it is necessary to take such a two-stage structure in order to drive a logical circuit at a low voltage.

This structure makes it possible to reduce the driving voltage (VD–VS) of a logic circuit composed of the shift register (305) and the NAND circuit (505-*n*) in the range where the performance of the polysilicon TFT does not deteriorate, and to secure the necessary driving voltage (VH–VL) of the driving circuit of the buffer unit composed of the second to fourth inverters (507-*n* to 509-*n*). Therefore, it is possible to realize a high-quality image, high reliability, and low power consumption.

[Patent Document 1] Japanese Unexamined Patent Application Publication No. 2000-163003

[Patent Document 2] Japanese Unexamined Patent Application Publication No. 2001-265297

SUMMARY

However, in the conventional configurations disclosed in Patent Documents 1 and 2, a voltage applied to the logical circuit is reduced, but a high voltage is applied to the buffer unit. Therefore, it is difficult to realize low power consumption and high reliability in the buffer unit. In addition, in both the High and Low sides, the level shifter has a series two-stage structure in order to shift potential. Therefore, there is a problem in that the operation speed of the circuit is low, which causes a bottleneck in the design of a high-precision panel.

Particularly, the polysilicon TFT is one-tenth to one/n-th times (where n is a natural number greater than 1 and smaller than 10) lower than a MOS transistor on a silicon wafer in movability. Therefore, in the case in which the scanning lines having the same capacitance are driven, when a buffer circuit of a driving circuit is composed of the polysilicon TFT, the area of the transistor is several to ten times larger than that of the MOS transistor on the silicon waver, which has a bad influence on yield or reliability. Thus, it is important to reduce the driving voltage of a buffer circuit unit.

In order to solve the above-mentioned problems, it is an object of the present invention to provide a scanning line driving circuit comprising two buffer circuits for amplifying the driving capacity for output timing signals from an timing circuit (power supply electric potential VD to VS) in which one of the buffer circuit is connected to a gate electrode of a P-type transistor, the other is connected to a gate electrode of an N-type transistor, drain electrodes of the P-type transistor and N-type transistor are connected to scanning lines, a source electrode of the P-type transistor is connected to a power supply having an electric potential VH and a source electrode of the N-type transistor is connected to a power supply having an electric potential VL. In the above scanning line driving circuit, a driving voltage of the first buffer circuit which is connected to the gate electrode of the N-type transistor is different from a driving voltage of the second buffer circuit which is connected to the gate electrode of the P-type transistor. In here, the relationship of $VH \geqq VD \geqq VS \geqq VL$ is satisfied. According to the above construction, the voltage applied to the respective buffer circuits can be set to be lower than that in the prior art which use only one buffer circuit, therefore, it is possible to realize low power consumption and high reliability. Further, by decreasing the driving voltage, it is possible to reduce the channel length of the transistor which forms a buffer portion. Therefore, the circuit area can reduced and the yield can improved.

In addition, after amplifying the timing signal by using the level shifter, there is no circuit, excluding inverter circuits which form the first and second buffer circuits, between the N/P-type transistors. Therefore, since only buffer circuits are driven at a high voltage and the other circuits are driven at a low voltage, the power consumption can be reduced and the reliability can be improved.

Further, according to a liquid crystal device of the present invention, all of the electric potentials of the power supply electrodes connected to the first buffer circuit are lower than the electric potential VD and all of the electric potentials of the power supply electrodes connected to the second buffer circuit are higher than the electric potential VS. Further, one electric potential of the power supply connected to the first buffer circuit is the electric potential VD and one electric potential of the power supply connected to the second buffer circuit is the electric potential VS. According to the above construction, the level shifter may shift a potential at High side or Low side with respect to an original signal potential. Therefore, there are advantages in that the level shifter circuit has a simple construction with a rapid operation speed and low power consumption.

Furthermore, according to the present invention, all of the electric potentials of the power supply electrodes connected to the first buffer circuit are substantially higher than the electric potential VL and all of the electric potentials of the power supply electrodes connected to the second buffer circuit are lower than the electric potential VH. According to the above construction, it is possible to maintain the driving voltage range of the buffer circuit in a minimum level and increase the reliability and the yield, while securing the minimum voltage required for turning OFF the N-type transistor and the P-type transistor.

Further, in the present invention, the driving voltage difference of the first buffer circuit is substantially equal to the driving voltage difference of the second buffer circuit. If so, the voltage is not loaded to only any one of the first and second buffer circuits, therefore, the reliability and the yield is extremely improved in view of the entire scanning line driving circuit.

Furthermore, in the present invention, a liquid crystal device in which signals input to the first buffer circuit and the second buffer circuit contain different timing signals is suggested. According to the above construction, it is possible to avoid the case when the P-type transistor and the N-type transistor are simultaneously turned on, which is effective in low power consumption. It is further effective in the liquid crystal device using a gate float-type common inversion driving method.

In addition, in the present invention, the level shifter is provided at a previous stage of only one of the first buffer circuit and the second buffer circuit and the other is directly connected the buffer circuit from the timing signal. According to the above construction, one of the level shifter decreases, and the voltage applied to one of the buffer circuits is low. Therefore, the channel length can be shortened, and the size of the driving circuit is reduced. Further, since the number of the level shifter circuits is reduced by half, the power consumption further decreases.

Further, in the present invention, an element for constructing the first and second buffer circuit is polysilicon TFT. The polysilicon TFT element on an active matrix substrate is inferior in the leak current amount or reliability compared to the other elements on the silicon wafer, has a low mobility, and has a large transistor in the buffer portion in the same scanning line capacity. Therefore, the effect of the present invention is remarkable. According to the above construction, in a display device having the driving circuit built-in in which the scanning line driving circuit is simultaneously formed on a substrate having a active matrix circuit, it is possible to provide a scanning line driving circuit having excellent reliability and yield.

Further, according to the present invention, a display device comprising the above scanning line driving circuit is suggested. The above-mentioned display device has an advantage in the low power consumption, high reliability, and high precision. Furthermore, as the above display device, there are a liquid crystal display (LCD), a liquid crystal light valve, an EL display, field emission type display (FED), and so on.

Further, the present invention suggests an electronic apparatus having a display device mounted thereon. By mounting the display device on the electronic apparatus, the reliability of the products is improved, and the power consumption is decreased. Therefore, the driving time can further reduced in the case of using the battery. Furthermore, it is possible to precisely mount the panel. Further, the electronic apparatus includes a monitor, a television, a notebook personal computer, PDA, an electronic book, a digital still camera, a video camera, a portable telephone, a photo viewer, a music storage, and so on.

DETAILED DESCRIPTION OF EMBODIMENTS

Hereinafter, embodiments of the present invention will be described with reference to the accompanying drawings.

First Embodiment

Figure 1:
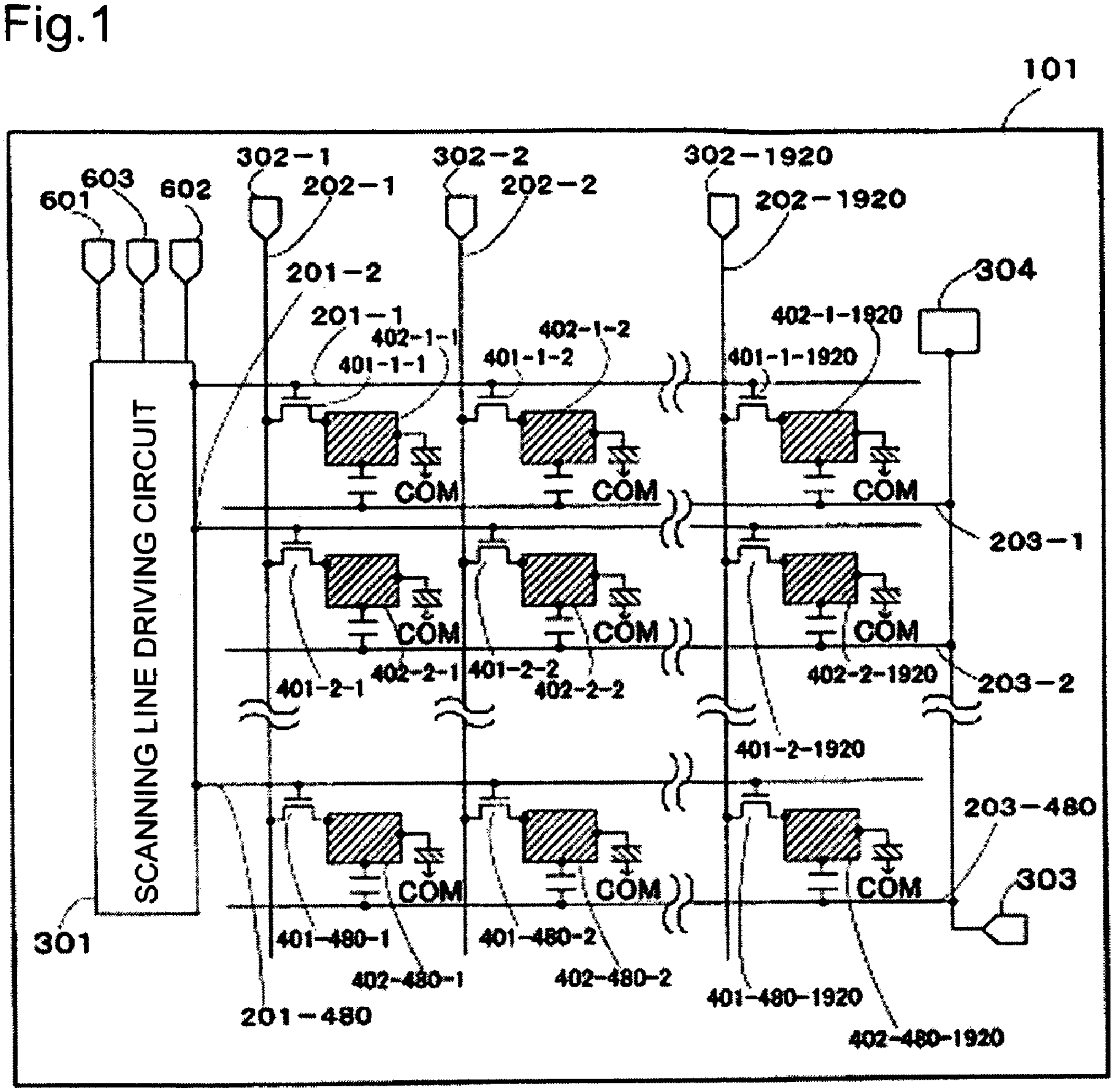
FIG. 1 is a diagram showing a configuration of an active matrix substrate according to an embodiment of the present invention.

FIG. 1 is a diagram showing a structure of an active matrix substrate having a scanning line driving circuit built-in in a first embodiment in which a liquid crystal display device of the present invention is embodied. On the active matrix substrate (101), 480 scanning lines (201-1 to 201-480) and 1920 data lines (202-1 to 202-1920) are formed so as to cross each other and 480 capacitive lines (203-1 to 203-480) are arranged so as to be provided parallel to the scanning lines (201-1 to 201-480) or the capacitive lines and the scanning lines are alternatively arranged. The data lines (202-1 to 202-1920) are connected to data line input terminals (302-1 to 302-1920). The capacitive lines (203-1 to 203-480) are short-circuited with each other to be connected to a common electric potential input terminal (303). In addition, an opposing electrically conductive portion (304) is connected to the common electric potential input terminal (303).

Pixel switching elements (401-*n*-*m*) composed of an N channel-type electric field effect thin film transistors are provided correspondingly to intersections of the scanning lines (201-*n*) and the data lines (202-*m*). Each of the pixel switching elements has a gate electrode connected to the scanning line (201-*n*) and source and drain electrodes connected to the data line (202-*m*) and a pixel electrode (402-*n*-*m*). The pixel electrode (402-*n*-*m*) forms an auxiliary capacitor together with the capacitive line (203-*n*) or forms a capacitor together with a counter substrate electrode (COM) with a liquid crystal element interposed therebetween when the pixel electrode is provided in the liquid crystal display device.

The scanning lines (201-1 to 201-480) are connected to a scanning line driving circuit (301) formed by depositing a polysilicon thin film transistor on an active matrix substrate to be supplied with the driving signal. A CLK signal terminal (601), a CLKX signal terminal (602), and an XST signal terminal (603) are connected to the scanning line driving circuit (301). In addition, a plurality of power supplies (not shown) is connected to the scanning line driving circuit.

Figure 2:
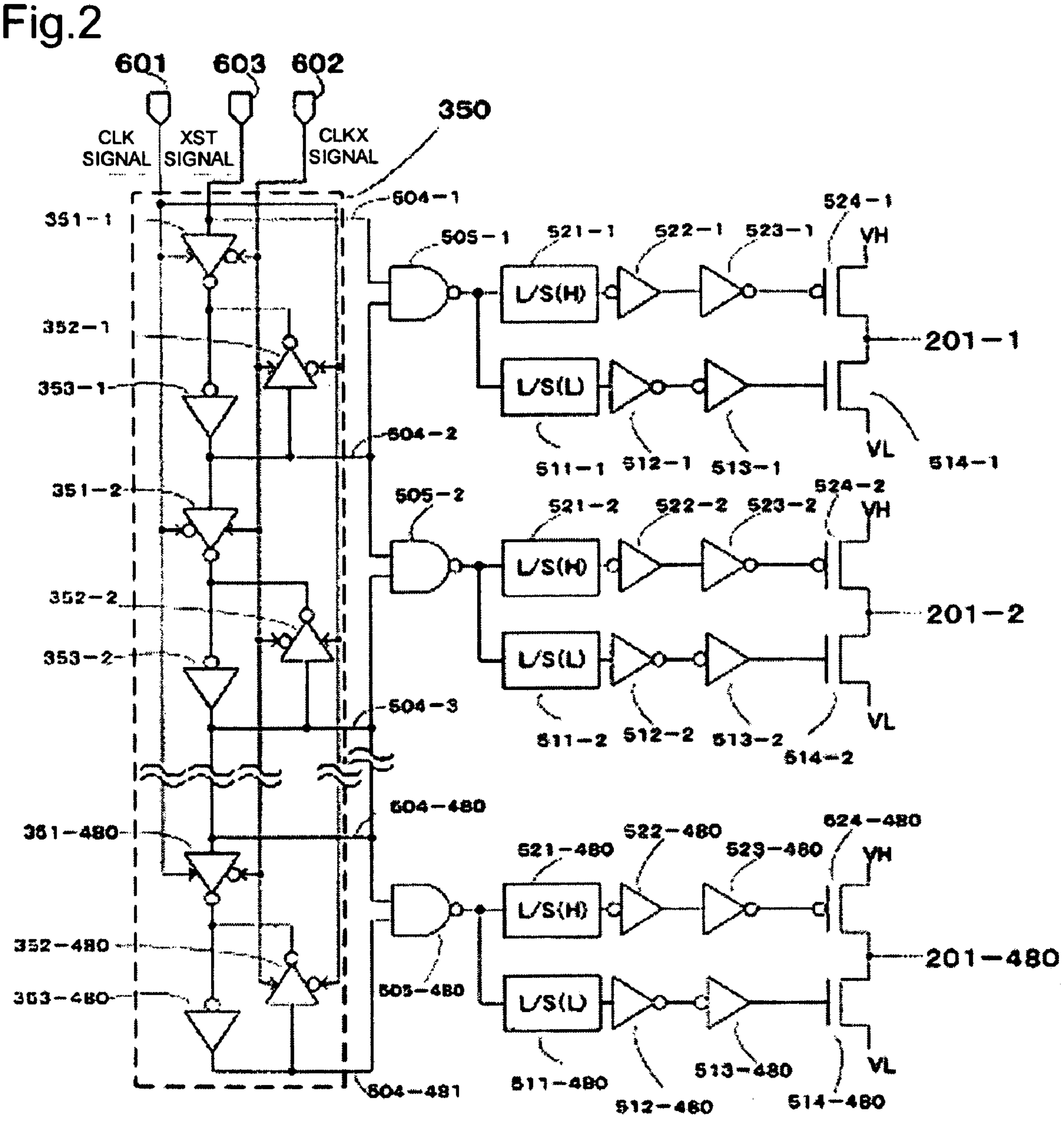
FIG. 2 is a circuit diagram of a scanning line driving circuit according to a first embodiment of the present invention.

FIG. 2 is a diagram showing a detail structure of the scanning line driving circuit (301). A shift register circuit (350) is built in the scanning line driving circuit (301) and the CLK signal terminal (601), the CLKX signal terminal (602) and the XST signal terminal (603) are connected thereto. The shift register circuit includes a first clocked inverter (351-*n*), a second clocked inverter (352-*n*), and output terminals (504-1 to 504-481) in which one stage is formed at a first inverter (353-*n*) and then 480 stages are formed, that is, 481 lines when including ends from a starting end to a terminating end.

An n-th (n=1 to 480) output terminal (504-*n*) and an n+1-th (n=2 to 481) output terminal (504-*n*+1) from the shift register circuit (350) are connected to a NAND circuit (505-*n*) and outputs of them are input to a first level shifter (511-*n*) and a second level shifter (521-*n*).

Figure 3:
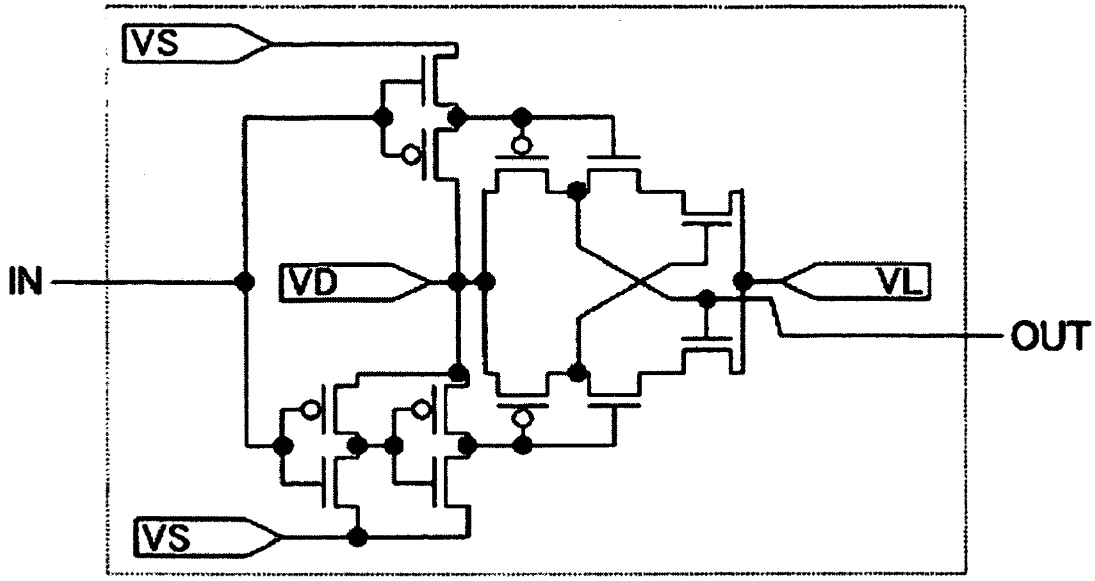
FIG. 3 is a circuit diagram of a first level shifter in the embodiment of the present invention.
Figure 4:
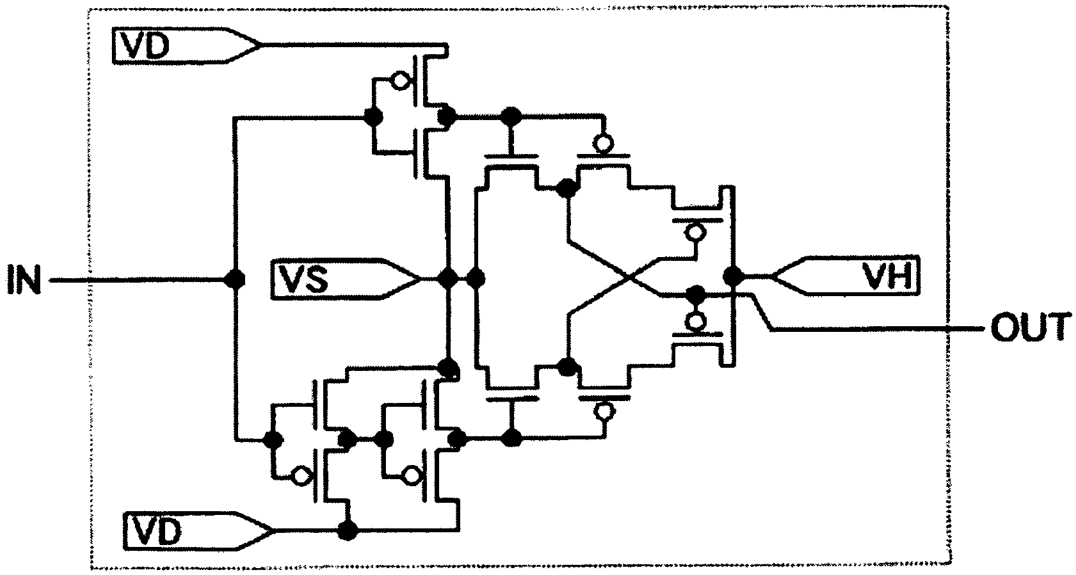
FIG. 4 is a circuit diagram of a second level shifter in the embodiment of the present invention.

FIG. 3 shows an example of a structure of the first level shifter (511-*n*) and FIG. 4 shows an example of a structure of the second level shifter (521-*n*). The first and second level shifters are flip-flop type level shifter circuits. The first level shifter coverts an electric potential input at the amplitude of VD−VS into an electric potential of VD−VL to output it, and the second level shifter coverts an electric potential input at the amplitude of VD−VS into an electric potential of VH−VS to output it. At this time, it is ideal that it is output with the same waveform as the input signal. However, in actual, a little signal delay and the distortion of signal waveform are caused by the characteristics of the polysilicon TFT. This will be described with reference to FIG. 5.

Figure 5:
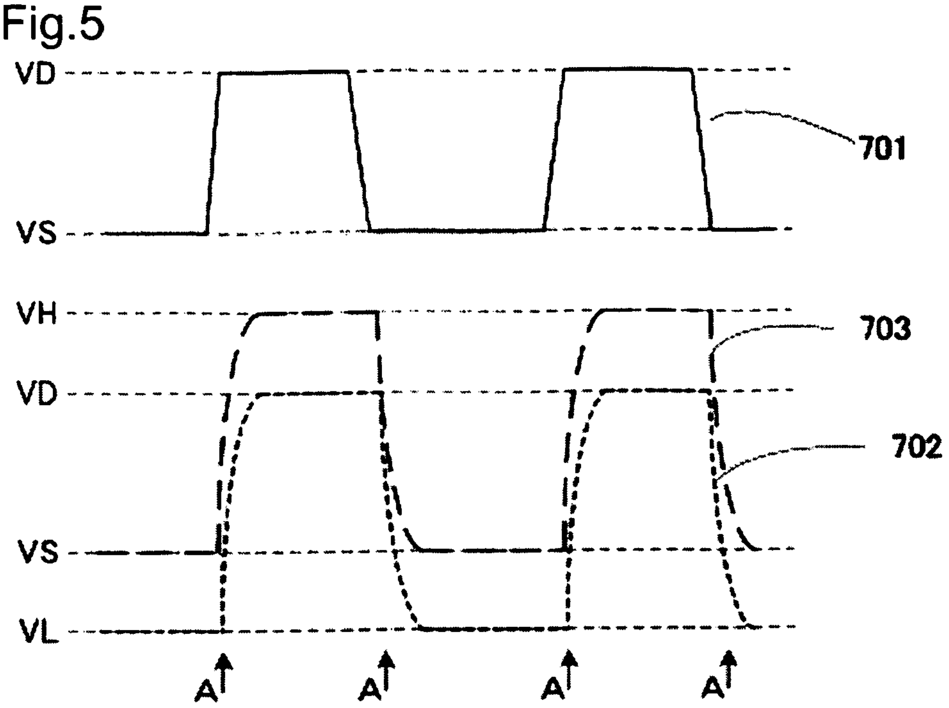
FIG. 5 is a timing chart in the first embodiment of the present invention.

FIG. 5 is a timing chart showing the operation of the first level shifter (511-*n*) and the second level shifter (521-*n*). In FIG. 5, a chart indicated by the reference numeral 701 represents an output signal (=signals input to the first and second level shifters) from a NAND circuit (505-*n*), a chart indicated by the reference numeral 702 represents an output signal from the first level shifter (511-*n*), and a chart indicated by the reference numeral 703 represents an output signal from the second level shifter (521-*n*). These level shifters using the polysilicon TFT has the signal delay and the distortion of signal waveform.

In addition, in FIG. 5, a VD indicates a driving voltage of a logic system circuit at the High side, a VS indicates a driving voltage of the logic system circuit at the Low side, a VH indicates a driving voltage of the driving system circuit at the High side, and a VL indicates a driving voltage of a driving system circuit at the low side. Here, the relationship of VH>VD>VS>VL is set. In addition, in order to equalize the voltage applied to the second and third inverters (512-1 and 513-*n*) and the fourth and fifth inverters (522-1 and 523-*n*), the relationship of VH−VS=VD−VL is preferable. The specific voltage is determined according to the panel size, the definition or the used liquid crystal. However, for example, the relationship of VH=15 V, VD=10 V, VS=5 V and VL=0 V may be used. In the following description, there values are used.

The output signals (electric potentials VD to VL) from the first level shifter (511-*n*) are connected to the gate electrode of the first transistor (514-2) serving as the N channel-type transistor through the second inverter (512-*n*) and the third inverter (513-*n*). Here, the second inverter (512-*n*) and the third inverter (513-*n*) are provided with the electric potential VD serving as the High side power supply and the electric potential VL serving as the Low side power supply. In addition, the source electrode of the first transistor (514-*n*) is connected to the electric potential VL.

On the other hand, the output signals (electric potentials VH to VS) from the second level shifter (521-*n*) are connected to the gate electrode of the second transistor (524-*n*) serving as the P channel-type transistor through the fourth inverter (522-*n*) and the fifth inverter (523-*n*). Here, the fourth inverter (522-*n*) and the fifth inverter (523-*n*) are provided with the electric potential VH serving as the High side power supply and the electric potential VS serving as the Low side power supply. In addition, the source electrode of the second transistor (524-*n*) is connected to the electric potential VH. In addition, the drain electrodes of the first transistor (514-*n*) and the second transistor (524-*n*) are connected to a scanning line bus line (201-*n*).

In addition, as the High side power supply of the fourth inverter (522-*n*) and the fifth inverter (523-*n*), the power supply having a value higher than the electric potential VH may be used. In addition, as the Low side power supply of the second inverter (512-*n*) and the third inverter (513-*n*), the power supply having a value lower than the electric potential VL may be used. If so, although the first transistor (514-2) or the second transistor (524-*n*) are subjected to the depression shift, it is possible to prevent the leak current from increasing. However, from the viewpoint of the reliability, this configuration is not preferable. In the case of the transistor which is surely turned off at the gate voltage (Vgs) (0 V) without shifting, it is preferable that the power supply is set like as in the present embodiment.

According to this configuration, at the timing when the High signal is transmitted through the shift register so that the shift register output stage n (504-*n*) and the shift register output stage n+1 (504-*n*+1) become the High state, the first transistor (514-*n*) connected to the n-th scanning line (201-*n*) is turned off, the second transistor (524-*n*) is turned on, and the electric potential of VH is applied to the scanning line (scanning line selecting period). At the other timing, the first transistor (514-*n*) is turned on and the second transistor (524-*n*) is turned off, so that the electric potential of VL can be applied (scanning line non-selecting period). In other words, the voltage of VH−VL=15 V is applied to the scanning line. On the other hand, the voltage of VD−VL=VH−VS=10 V is applied to the second inverter (512-*n*), the third inverter (513-*n*), the fourth inverter (522-*n*), and the fifth inverter (523-*n*). As a result, by applying the sufficient voltage to the scanning line, it is possible to prevent the image quality from deteriorating like the shortage of writing the data to the pixel TFT and it is possible to suppress reliability reduction or the increase of the leak current from generating in the second inverter (512-*n*), the third inverter (513-*n*), the fourth inverter (522-*n*), and the fifth inverter (523-*n*).

Figure 11:
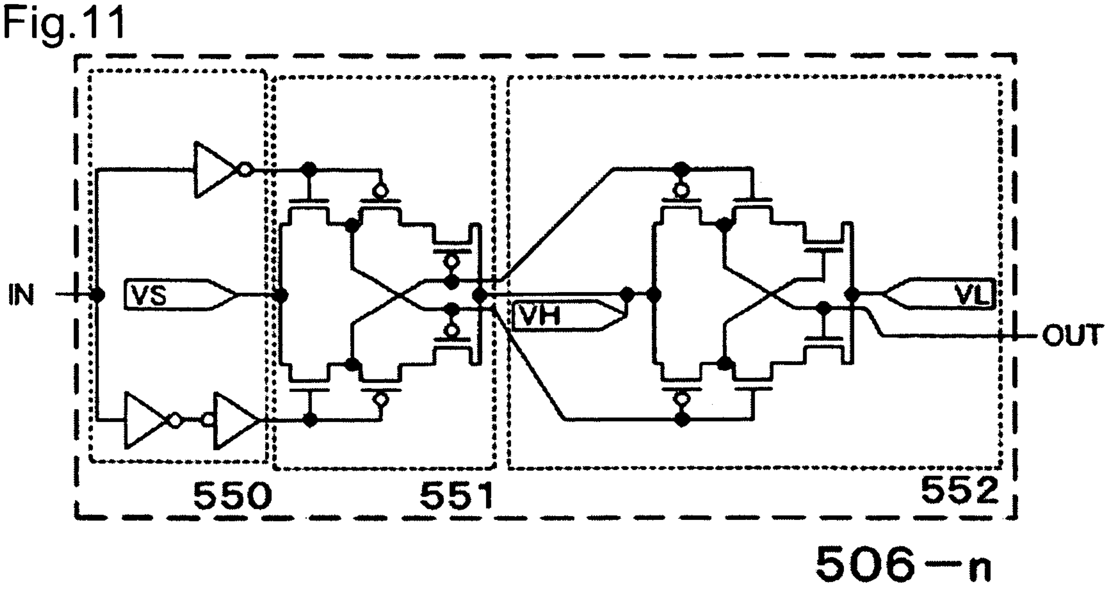
FIG. 11 is a circuit diagram of a level shifter according to the prior art.

Further, the second inverter (512-*n*) and the third inverter (513-*n*) are connected to the potential VD or less as a power supply, and the fourth inverter (522-*n*) and the fifth inverter (523-*n*) are connected to the potential VS or more. Thus, the first level shifter (511-*n*) and the second level shifter (521-*n*) can be configured with only the low-voltage-side level shifter and the high-voltage-side level shifter, respectively. Thus, the first level shifter (511-*n*) and the second level shifter (521-*n*) can operate at high speed as compared to the prior art in which the high-voltage-side level shifter and the low-voltage-side level shifter are connected in series as shown in FIG. 11. The input signals to the respective level shifters are input in parallel, and thus the entire scanning line driving circuit can operate at earlier frequency. Therefore, the scanning line driving circuit which can implement a high definition panel as compared to the prior art is configured.

Figure 6:
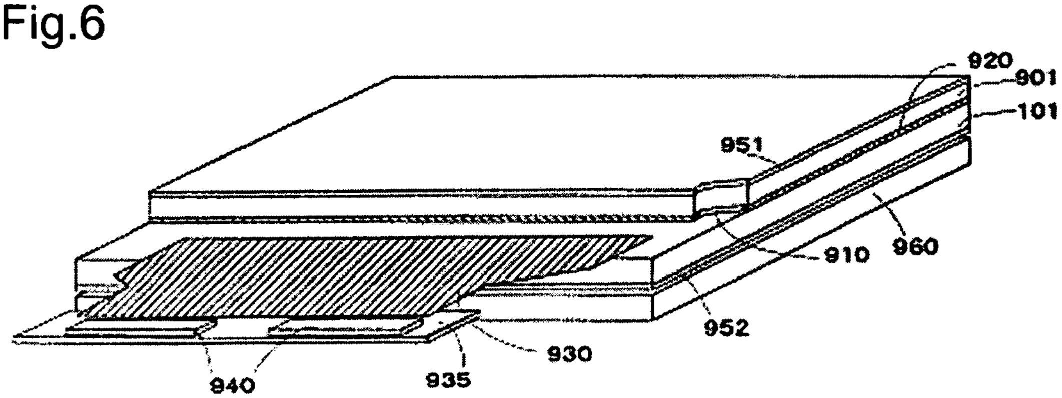
FIG. 6 is a perspective view (a partial cross-sectional view) of a liquid crystal display device in the embodiment of the present invention.

FIG. 6 is a perspective view showing a configuration of a transmissive liquid crystal display device which is an example of a display device according to the first embodiment of the present invention. The active matrix substrate (101) as shown in FIG. 1 and a counter substrate (901) on which an electrode is formed by film-forming ITO on a color filter substrate are bonded to each other by means of a sealing member (920), and a nematic-phase liquid crystal material (910) is sealed between both substrates. Though not shown, alignment materials are coated on surfaces of the active matrix substrate (101) and the counter substrate (901) contacting the liquid crystal material (910) and rubbing treatments are performed on the coated alignment materials in positions orthogonal to each other. Further, a connecting member is arranged in the counter connecting portion (304) the active matrix substrate (101) and is electrically shorted to the common electrode of the counter substrate (901).

Data line input terminals (302-1 to 302-1920), a common potential input terminal (303), a CLK signal terminal (601), a CLKX signal terminal (602), a start pulse signal terminal (603), or various power supply terminals are connected to one or a plurality of external ICs (940) on a circuit board (935) via a FPC (930) which is mounted on the active matrix substrate (101), thereby to supply required electrical signals and potentials.

Further, an upper polarizing plate (951) is arranged outside the counter substrate and a lower polarizing plate (952) is arranged outside the active matrix substrate (101). In this case, the upper polarizing plate (951) and the lower polarizing plate (952) are arranged such that polarization directions thereof are orthogonal to each other (crossed nicols). Further, a backlight unit (960) is attached below the lower polarizing plate (952), such that the transmissive liquid crystal display device is manufactured. As the backlight unit (960), one in which a light-guiding plate or a scattering plate is attached to a cold-cathode tube or a unit which emits by means of an EL element may be used. Though not shown, if necessary, its periphery may be covered with an outer shell or a protective glass or an acryl plate may be further attached on the upper polarizing plate. Further, in order to improve a viewing angle, an optical compensation film may be bonded.

In the liquid crystal display device configured in such a manner, low current consumption and high reliability can be realized as compared to the prior art, and a high definition panel can be manufactured. Further, in an electronic apparatus which uses such a liquid crystal display device, reliability can be enhanced, power consumption can be reduced, and thus a high definition display unit can be implemented.

Second Embodiment

Figure 7:
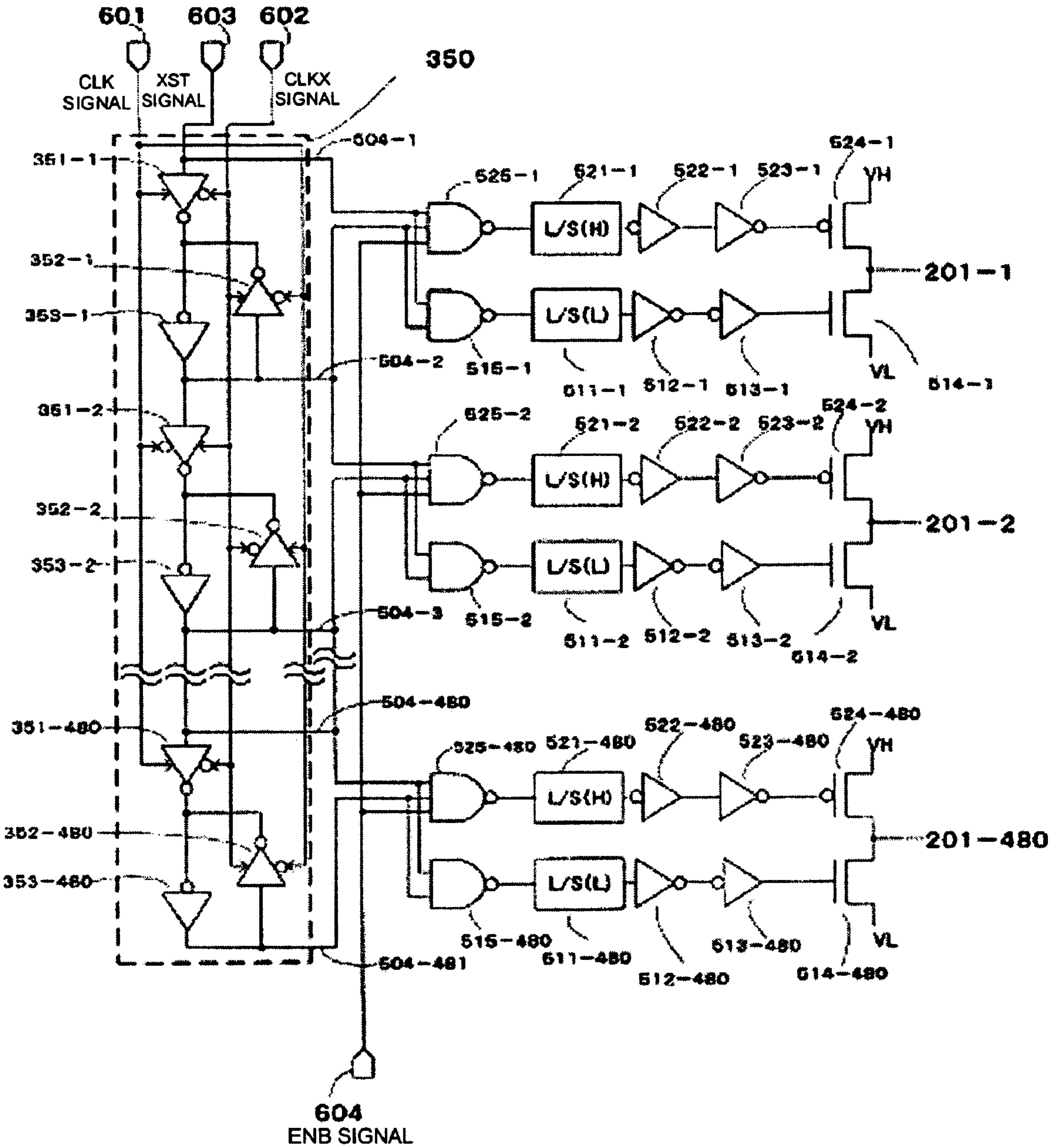
FIG. 7 is a circuit diagram of a scanning line driving circuit according to a second embodiment of the present invention.

FIG. 7 is a diagram showing a configuration of a liquid crystal display device and a scanning line driving circuit according to a second embodiment of the present invention. For comparison to the first embodiment, the description will be given while comparing FIG. 7 to FIG. 2.

Referring to FIG. 7, in the present embodiment, an ENB signal is input via an ENB signal terminal (604). The ENB signal is input to a three-input NAND circuit (525-*n*) and outputs (504-*n* and 504-*n*+1) from a shift register are input to the three-input NAND circuit (525-*n*) and the NAND circuit (515-*n*) in parallel. In this case, the ENB signal is not input to the NAND circuit (515-*n*). An output of the NAND circuit (515-*n*) is input to a first level shifter (511-*n*) and an output of the three-input NAND circuit (525-*n*) is connected to an input of a second level shifter (521-*n*). Elements other than the above-described elements, such as a shift register unit (350), are the same as those of the first embodiment shown in FIG. 2.

Figure 8:
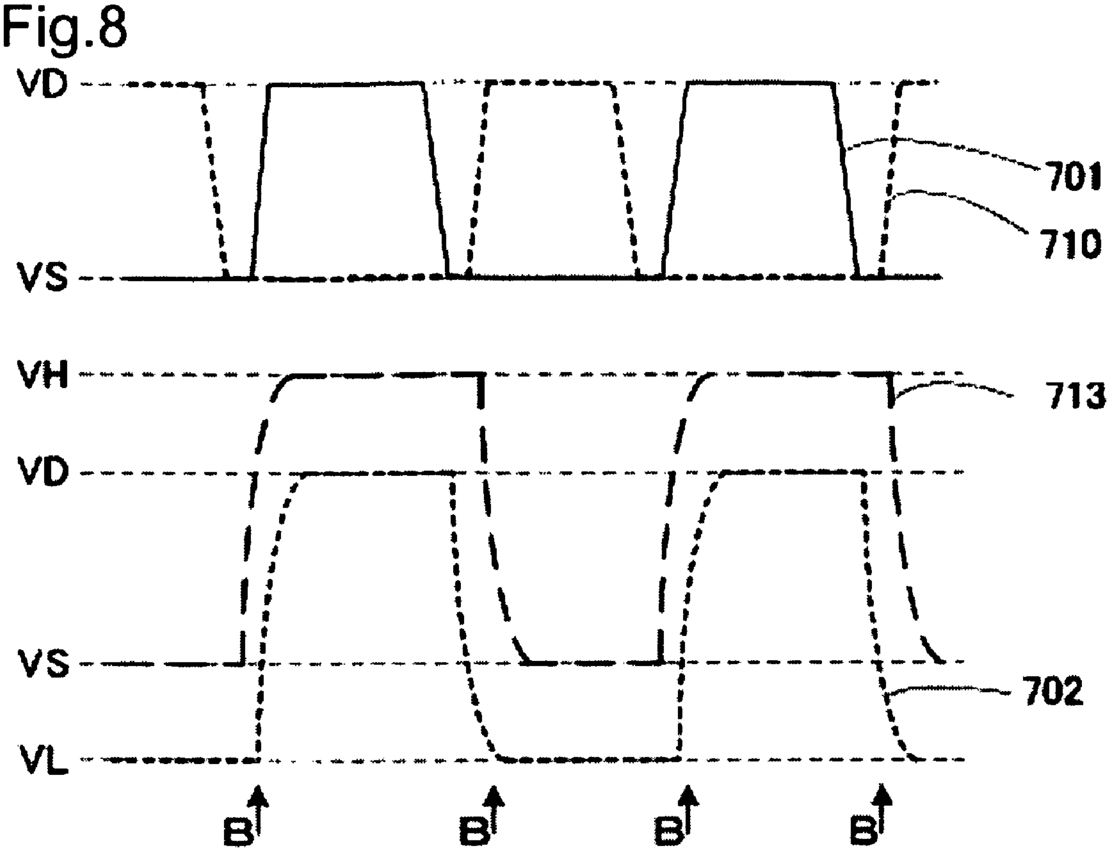
FIG. 8 is a timing chart in the second embodiment of the present invention.

FIG. 8 is an example of a timing chart according to the second embodiment. A chart indicated by the reference numeral 701 represents an output signal from the NAND circuit (515-*n*) and a chart indicated by the reference numeral 702 represents an output signal of the first level shifter (511-*n*). These charts are the same as those of FIG. 5 in the first embodiment. On the other hand, a chart indicated by the reference numeral 710 represents the ENB signal input via the ENB signal terminal (604). The ENB signal is set to be High (potential: VD) during a period in which the output signal from the NAND circuit (525-*n*) indicated by the reference numeral 701 is Low (potential: VS), that is, during a slightly shorter period in which potentials of an n-stage output terminal (504-*n*) and an n+1-stage output terminal (504-*n*+1) from the shift register are High (potential: VD) together. If so, it can be seen that a chart representing an output signal from the second level shifter (521-*n*) is as indicated by the reference numeral 713, and, by the ENB signal, a period in which the chart indicated by the reference numeral 713 is Low and thus a second transistor (524-*n*) is turned on, that is, a period in which the scanning line is selected is shorter than the chart 703 in the first embodiment. That is, at a moment that the output signal of the first level shifter (511-*n*) indicated by the chart 702 as an arrow B of FIG. 8 is inverted, the output signal indicated of the second level shifter indicated by the chart 713 has a sufficiently high potential (≈VH) in advance. Thus, at the timing that a first transistor (514-*n*) is turned on, the second transistor (524-*n*) is surely turned off. Specifically, the power supply potential VH and the power supply potential VL are simultaneously connected to the scanning line with low impedance as the timing A of FIG. 5 in the first embodiment. Thus, there is no case in which large current flows into the power supply potential VH and the power supply potential VL via the scanning line.

As such, the timing of the signal input to a first buffer circuit having the first level shifter (511-1), the second inverter (512-1), and the third inverter (513-1) is made different from that of the signal input to a second buffer circuit having the second level shifter (521-1), the fourth inverter (522-1), and the fifth inverter (523-1). Thus, in the circuit shown in the second embodiment, current consumption can be further reduced as compared to the circuit shown in the first embodiment. Further, the voltage of the power supply line can be prevented from fluctuating in a moment.

Moreover, as for the configuration of the active matrix substrate, the circuit configuration of the level shifter, and the module configuration of the liquid crystal display device, FIGS. 1, 3 to 4, and 6 in the first embodiment can be referred to, which show the same configuration as those of the second embodiment.

Further, when the scanning line driving circuit having such a configuration is applied to the liquid crystal display device, the first transistor (514-*n*) and the second transistor (524-*n*) are controlled to be turned off together, and thus the scanning line is in a floating state in which it is not connected to any power supplies. Thus, it is particularly effective to perform a gate float-type common inversion driving.

Third Embodiment

Figure 9:
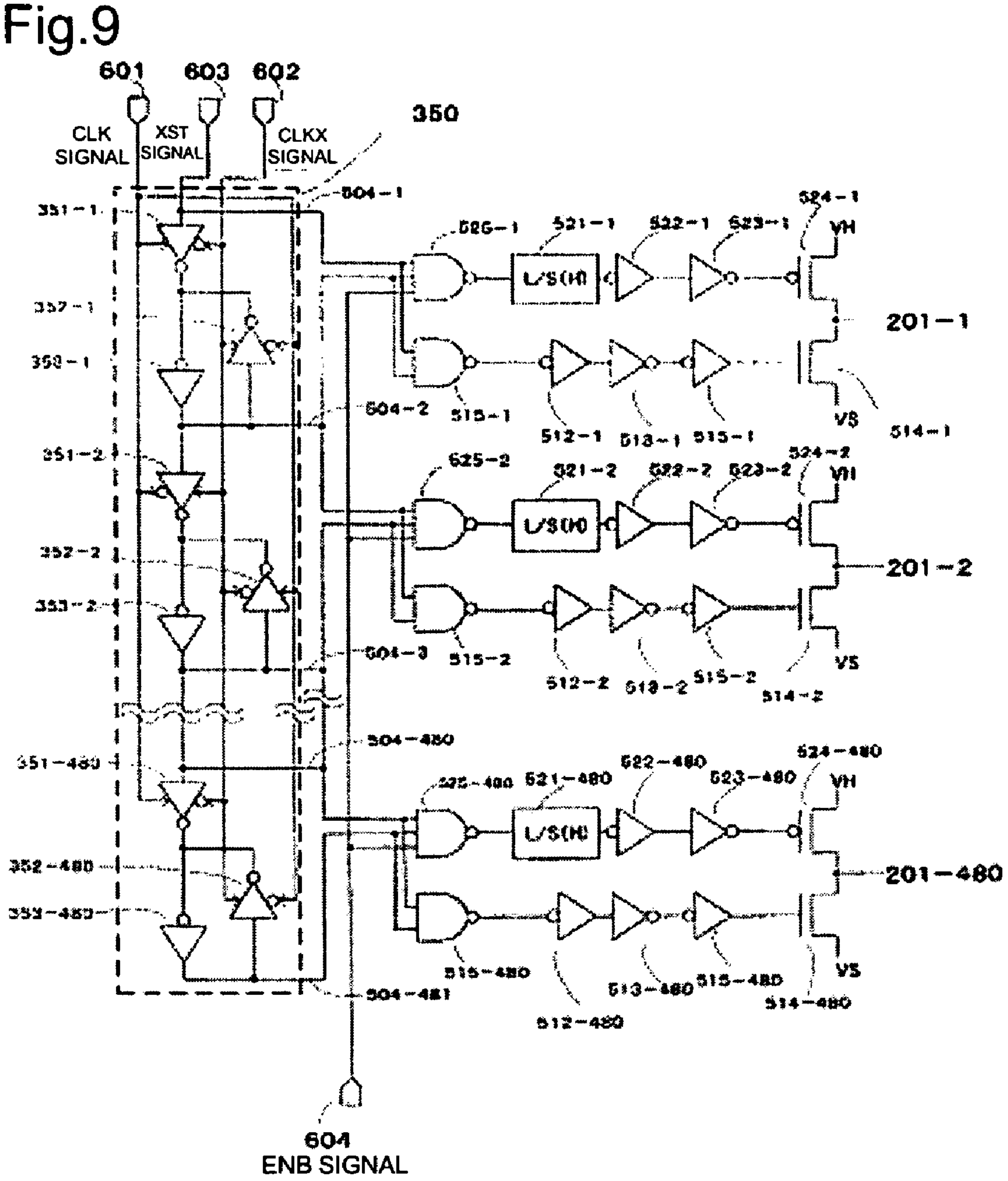
FIG. 9 is a circuit diagram of a scanning line driving circuit according to a third embodiment of the present invention.
Figure 10:
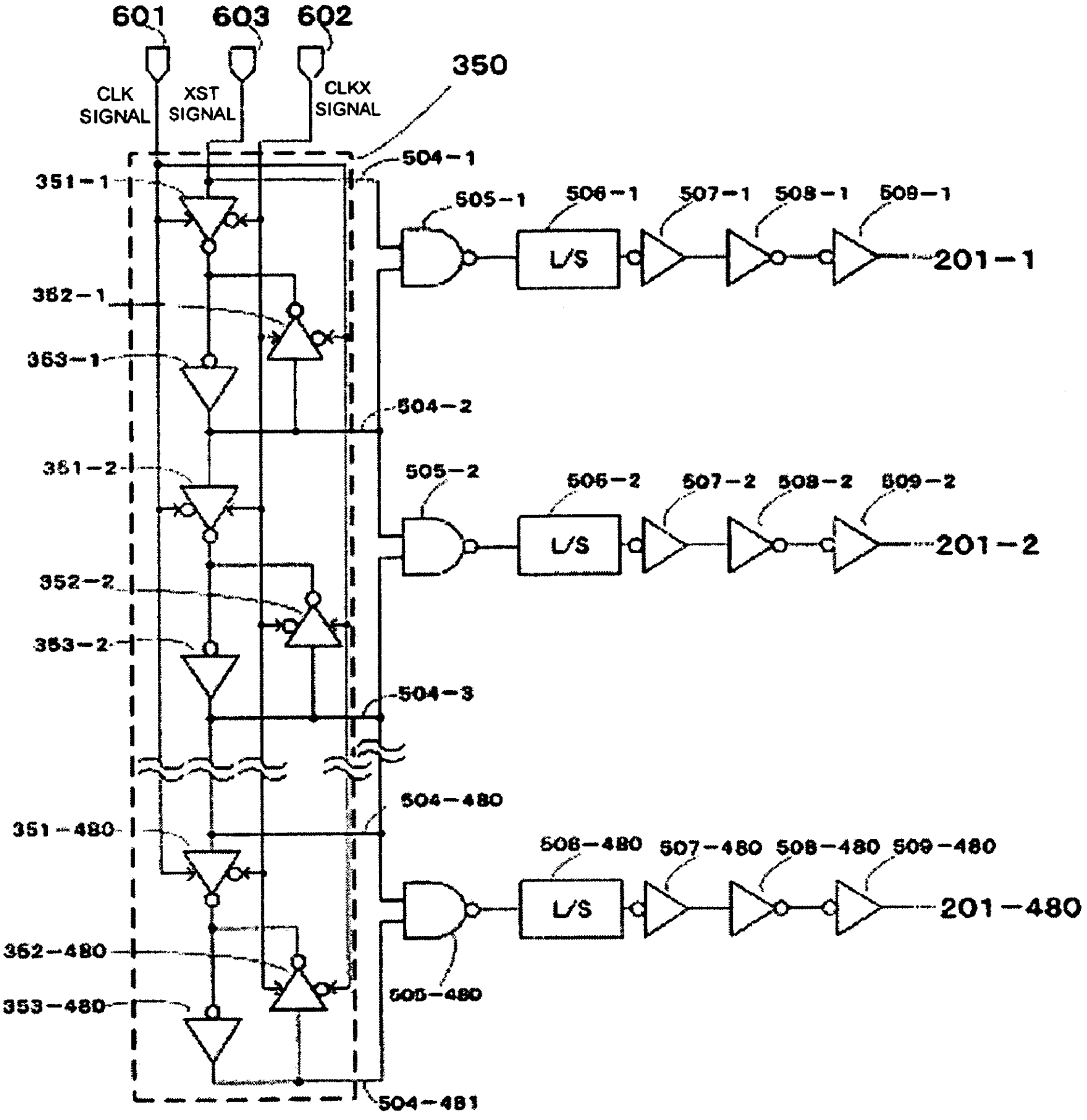
FIG. 10 is a circuit diagram of a scanning line driving circuit according to a prior art.

FIG. 9 is a diagram showing a configuration of a liquid crystal display device and a scanning line driving circuit according to a third embodiment of the present invention. In order to compare to the second embodiment, the difference between FIG. 7 and FIG. 9 will be described.

In the present embodiment, the first level shifter (511-*n*) of the second embodiment is substituted with a sixth inverter (515-*n*) and VL is set to be equal to VS. Specifically, the driving voltages of the second, third, and sixth inverters (512-*n*, 513-*n*, and 515-*n*) are set to VD (10 V) to VS (5 V) equal to that of the shift register circuit 350.

Therefore, in the present embodiment, the difference (5 V) between the driving voltages applied to the second, third, and sixth inverters (512-*n*, 513-*n*, and 515-*n*) is smaller than the difference (10 V) between the voltages applied to the fourth inverter (522-*n*) and the fifth inverter (523-*n*). Further, the level of the signal which is finally imparted to the scanning line is in a range of from VS (5 V) to VH (15 V).

It is not preferable that the potential difference between the scanning lines is large, since an excessive load is applied to the fourth inverter (522-*n*) and the fifth inverter (523-*n*) in the circuit configuration of the present embodiment. However, when a liquid crystal having a small driving voltage is used or when a relatively small and low definition display device is required, the voltage difference imparted to the scanning lines, and thus there is no problem in reliability even when such a configuration is adopted. On the other hand, the inverter circuit has a small occupied area and low current consumption as compared to the level shifter circuit, and thus the circuit area and total power consumption are drastically reduced. Further, in order to reduce the driving voltage of each of the second, third, and sixth inverters (512-*n*, 513-*n*, and 515-*n*), the channel length can be set short. From this point, the circuit area is further reduced.

In addition, the timing or the operation is the same as that of the second embodiment.

INDUSTRIAL AVAILABILITY

The present invention is not limited to the above-described embodiments, but the logical circuit of the scanning line driving circuit may be arbitrarily configured. For example, a sequential selection circuit may be used instead of the shift register, without causing any problems.

Further, the present invention can be applied to a liquid crystal display device in which a driver-embedded active matrix substrate having the data line driving circuit built-in is used, in addition to the scanning line driving circuit. As the pixel switching element, in addition to the N-type transistor, a P-type transistor or a complementary transmission gate may be used. Further, instead of polysilicon, an amorphous silicon thin film transistor may be used. Further, an active matrix substrate in which the thin film transistor may be formed on an insulating substrate or in which the pixel switching element or the driving circuit may be formed on a crystal wafer may be used.

Further, as a liquid crystal display device, instead of the transmissive in the embodiments, a reflective or a transflective type may be used. Further, instead of a direct-view type, the liquid crystal display device may be used for a light valve for imaging. Further, in addition to the normally white mode, a normally black mode may be used. In this case, particularly, as an alignment mode of the liquid crystal, a vertical alignment mode (VA) or an in-plane switching mode may be used. In the latter case, the common electrode is formed only on the active matrix substrate 101.

Further, in addition to the liquid crystal display device, the present invention can be applied to a scanning line driving circuit of an organic EL display device, a field emission display device, or the like, or a scanning line driving circuit of an optical sensor using a liquid crystal display device, a touch sensor, or the like.

What is claimed is:

1. A scanning line driving circuit for driving a plurality of scanning lines of an active matrix substrate which has a plurality of switching elements and the plurality of scanning lines connected to the switching elements, comprising:

a timing circuit for outputting at least one timing signal to each scanning line, the timing signal indicating a selection timing where a select potential is applied to the plurality of scanning lines and a non-selection timing where a non-select potential is applied thereto;

a first buffer circuit for amplifying the driving capacity of the timing signal;

a second buffer circuit for amplifying the driving capacity of the timing signal;

a level shifter circuit for amplifying the amplitude of a timing signal potential connected to input terminals of the first buffer circuit or the second buffer circuits and an output terminal of the timing circuit;

a first transistor serving as an N-channel electric field effect transistor and having a gate electrode connected to an output terminal of the first buffer circuit; and a second transistor serving as a P-channel electric field effect transistor and having a gate electrode connected to an output terminal of the second buffer circuit;

wherein a drain electrode of the first transistor and a drain electrode of the second transistor are connected to one of the scanning lines, respectively, a power supply electrode having an electric potential VL is connected to a source electrode of the first transistor a power supply electrode having an electric potential VH is connected to a source electrode of the second transistor, the timing circuit is connected to a power supply electrode having an electric potential VD and a power supply electrode having an electric potential VS, the electric potential VS is lower than the electric potential VD, the electric potential VL is lower than the electric potential VS, and the electric potential VH is higher than the electric potential VD, at least one electric potential of the power supply electrodes connected to the first buffer circuit is substantially equal to the electric potential VD, and at least one electric potential of the power supply electrodes connected to the second buffer circuit is substantially equal to the electric potential VS.

2. The scanning line driving circuit according to claim 1, wherein inverter (NOT) circuits for constructing the first and second buffer circuits are provided between the first and second transistors and the level shifter circuit.

3. The scanning line driving circuit according to claim 1, wherein all of the electric potentials of the power supply electrodes connected to the first buffer circuit are lower than the electric potential VD.

4. The scanning line driving circuit according to claim 1, wherein all of the electric potentials of the power supply electrodes connected to the second buffer circuit are higher than the electric potential VS.

5. The scanning line driving circuit according to claim 1, wherein maximum difference (driving voltage) of the electric potential of the power supply electrodes connected to the first buffer circuit is substantially equal to the maximum difference (driving voltage) of the electric potential of the power supply electrodes connected to the second buffer circuit.

6. The scanning line driving circuit according to claim 1, wherein all of the electric potentials of the power supply electrodes connected to the first buffer circuit are substantially higher than the electric potential VL.

7. The scanning line driving circuit according to claim 1, wherein all of the electric potentials of the power supply electrodes connected to the second buffer circuit are lower than the electric potential VH.

8. The scanning line driving circuit according to claim 1, wherein the level shifter circuit is formed only between any one of the input terminal of the first buffer circuit and the input terminal of the second buffer circuit and the output terminal of the timing circuit, and any one of the input terminal of the first buffer circuit and the input terminal of the second buffer circuit is directly connected to the output terminal of the timing circuit.

9. The scanning line driving circuit according to claim 1, wherein timing signals which are input to the first buffer circuit or the second buffer circuit are different from each other.

10. The scanning line driving circuit according to claim 1, wherein the first buffer circuit and the second buffer circuit are made of polysilicon thin film transistors which have a polysilicon thin film as a functional layer.

11. A display device comprising a scanning line driving circuit according to claim 1.

12. An electronic apparatus comprising a display device according to claim 11.

* * * * *